United States Patent
Lee et al.

(10) Patent No.: US 8,004,357 B2
(45) Date of Patent: Aug. 23, 2011

(54) METHOD AND APPARATUS FOR CONTROLLING HIGH POWER AMPLIFIER IN COMMUNICATION SYSTEM

(75) Inventors: Jong-Hyun Lee, Hwaseong-si (KR); Dong-Geun Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/819,554

(22) Filed: Jun. 21, 2010

(65) Prior Publication Data

US 2010/0321108 A1 Dec. 23, 2010

(30) Foreign Application Priority Data

Jun. 22, 2009 (KR) ........................ 10-2009-0055547

(51) Int. Cl.
*H03G 3/20* (2006.01)
(52) U.S. Cl. ....................................... 330/136; 330/129
(58) Field of Classification Search .................. 330/129, 330/136, 285, 296
See application file for complete search history.

(56) References Cited

U.S. PATENT DOCUMENTS

| | | | |
|---|---|---|---|
| 6,741,127 B2 * | 5/2004 | Sasho et al. | 330/136 |
| 7,193,470 B2 * | 3/2007 | Lee et al. | 330/285 |
| 7,479,832 B2 * | 1/2009 | Imayama | 330/257 |
| 7,541,867 B2 * | 6/2009 | Taylor | 330/136 |

* cited by examiner

*Primary Examiner* — Henry Choe
(74) *Attorney, Agent, or Firm* — Jefferson IP Law, LLP

(57) ABSTRACT

An apparatus and method for controlling a high power amplifier in a communication system are provided. The apparatus includes a Radio Frequency (RF) power detection unit for detecting an intensity of an RF input signal, a high power amplifier controller for determining a control signal, which indicates a voltage value of a drain bias to be provided to at least one drain node from among drain nodes of a drive amplifier and a main amplifier included in the high power amplifier, according to the detected intensity, a Direct Current (DC) voltage supplying unit for generating a DC voltage corresponding to the determined control signal, a drain bias connection unit for providing the generated DC voltage to said at least one drain node from among the drain nodes of the drive amplifier and the main amplifier, and the drive amplifier and the main amplifier for amplifying the RF input signal according to the provided DC voltage.

8 Claims, 6 Drawing Sheets

METHOD AND APPARATUS FOR CONTROLLING HIGH POWER AMPLIFIER IN COMMUNICATION SYSTEM

PRIORITY

This application claims the benefit under 35 U.S.C. §119(a) of a Korean patent application filed in the Korean Industrial Property Office on Jun. 22, 2009 and assigned Serial No. 10-2009-0055547, the entire disclosure of which is hereby incorporated by reference.

BACKGROUND OF THE INVENTION

1. Field of the Invention

The present invention relates to an apparatus and a method for controlling a high power amplifier in a communication system. More particularly, the present invention relates to an apparatus and a method for controlling a high power amplifier in order to optimize the efficiency of the high power amplifier according to the intensity of an input signal.

2. Description of the Related Art

In communication systems of the related art, a high power amplifier outputs a Radio Frequency (RF) output signal with a predefined power level.

FIG. 1 is a block diagram illustrating a structure of a high power amplifier according to the related art.

Referring to FIG. 1, the high power amplifier includes a drive amplifier 101 and a main amplifier 103. Each of the drive amplifier 101 and the main amplifier 103 receives a fixed drain bias and gate bias applied thereto, amplifies an RF input signal, and outputs an RF output signal. These high power amplifiers output RF output signals according to a fixed drain bias regardless of the communication environment. For example, the high power amplifiers output RF output signals according to a fixed drain bias regardless of the time of day. However, communication systems are typically used more during the day than the night.

Meanwhile, as communication systems become more complicated, have a wider variety of functions, and require higher data transmission/reception speeds, the efficiency of the communication systems has emerged as an important issue.

However, the high power amplifier, which operates based on a fixed drain bias and outputs the RF output signal with constant power intensity regardless of the communication environment, is one of the main factors degrading the efficiency of the communication systems. Such degradation in the efficiency of the communication systems may increase the operation cost of the communication systems. Also, in order to overcome the low thermal efficiency of the high power amplifier, the high power amplifier may be equipped with a large heat sink or employ an enhanced cooling method, which may enlarge the entire size of the high power amplifier. Therefore, there has been a desire for a solution capable of optimizing the efficiency of the high power amplifier in order to minimize the heat radiation and size.

SUMMARY OF THE INVENTION

An aspect of the present invention is to address at least the above-mentioned problems and/or disadvantages and to provide at least the advantages described below. Accordingly, an aspect of the present invention is to provide an apparatus and a method for optimizing the efficiency of a high power amplifier by using a drain bias.

In addition, an aspect of the present invention is to provide an apparatus and a method for optimizing the efficiency of a high power amplifier by changing a drain bias according to the intensity of a Radio Frequency (RF) input signal.

In accordance with an aspect of the present invention, an apparatus for controlling a high power amplifier in a communication system is provided. The apparatus includes an RF power detection unit for detecting an intensity of an RF input signal, a high power amplifier controller for determining a control signal, which indicates a voltage value of a drain bias to be provided to at least one drain node from among drain nodes of a drive amplifier and a main amplifier included in the high power amplifier, according to the detected intensity, a Direct Current (DC) voltage supplying unit for generating a DC voltage corresponding to the determined control signal, a drain bias connection unit for providing the generated DC voltage to said at least one drain node from among the drain nodes of the drive amplifier and the main amplifier, and the drive amplifier and the main amplifier for amplifying the RF input signal according to the provided DC voltage.

In accordance with another aspect of the present invention, a method of controlling a high power amplifier in a communication system is provided. The method includes detecting an intensity of an RF input signal, determining a control signal, which indicates a voltage value of a drain bias to be provided to at least one drain node from among drain nodes of a drive amplifier and a main amplifier included in the high power amplifier, according to the detected intensity, generating a DC voltage corresponding to the determined control signal, providing the generated DC voltage to said at least one drain node from among the drain nodes of the drive amplifier and the main amplifier, and amplifying the RF input signal according to the provided DC voltage.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 2:
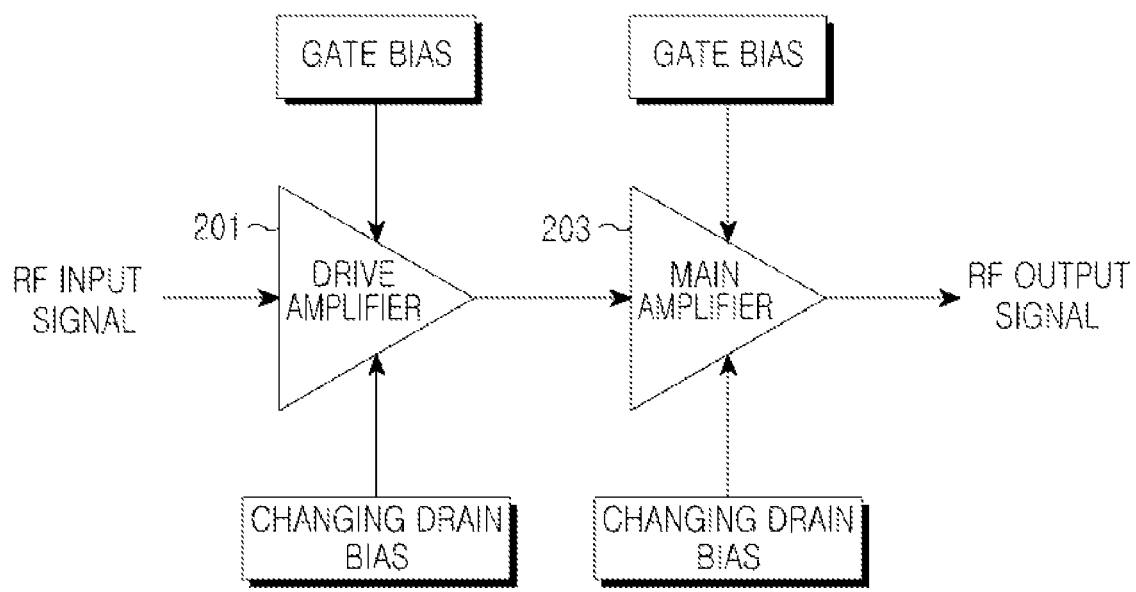
FIG. 2 illustrates a structure of a high power amplifier according to an exemplary embodiment of the present invention.

FIG. 2 illustrates a structure of a high power amplifier according to an exemplary embodiment of the present invention.

Referring to FIG. 2, the high power amplifier includes a drive amplifier 201 and a main amplifier 203. A drain bias, which changes according to the intensity of an RF input signal, and a fixed gate bias are applied to the drive amplifier 201 and the main amplifier 203. Herein, based on the applied drain bias, the drive amplifier 201 and the main amplifier 203 amplify an RF input signal to generate an RF output signal, and then output the generated RF output signal to the next node (e.g., an antenna node).

Here, the intensity of the RF input signal may change according to the number of users of the communication system, the quantity of data traffic, or other factors. For example, the RF input signal may have a first intensity during the day time when many users use the communication system, and the RF input signal may have a second intensity, that is lower than the first intensity, during the night time when fewer users use the communication system. Here, the first intensity may be the rated intensity for the RF input signal.

According to an exemplary embodiment of the present invention, since the drain bias changes according to the RF input signal, the drain bias changes according to the number of users of the communication system, the quantity of data traffic, or other factors. Further, since the high power amplifier amplifies the RF input signal according to the changing drain bias, it is possible to optimize the power efficiency by reducing the power consumption of the high power amplifier.

In more detail, in the case where the RF output signal is output with a first power, the high power amplifier has an optimum efficiency when a predefined drain bias is applied to the high power amplifier. However, in a particular situation, for example, during a time when there are a small number of users, outputting of an RF output signal at the first power by a high power amplifier may degrade the operation efficiency of the communication system. Here, the first power may be the rated power for the high power amplifier. Therefore, the high power amplifier of an exemplary embodiment of the present invention changes the drain bias according to the intensity of the RF input signal, thereby optimizing the Direct Current (DC) power consumption of the high power amplifier and optimizing the efficiency of the communication system.

For example, if an RF output signal is output during the daytime, when there are many users, with a first power of 46 dBm, a drain bias of 31 V, and a consumed current of 5.56 A, the DC power consumption quantity is determined as 172.4 W (=31 V*5.56 A) based on the formula, P=V*I, and the first power of 46 dBm is converted to 40 W (Watts). By using the DC power consumption quantity of 172.4 W and the RF output signal power of 40 W in Equation (1) below, the efficiency is determined to be about 23.2%. Here, the first power may be the rated power for the high power amplifier.

$$\text{Efficiency} = \frac{RF \text{ output power}}{DC \text{ power consumption}} \times 100 \quad (1)$$

If the number of users decreases so that 43 dBm, which is one half of the first power, is sufficient for providing a service through the RF output signal, a lower drain bias of 26 V may be applied. At this time, the high power amplifier consumes a current of 3.88 A, so that the DC power consumption is reduced to 100.88 W (=26 V*3.88 A).

As described above, the DC power consumption (i.e., 100.88 W) at the time of outputting the RF output signal with one half of the rated power is 71 W less than the DC power consumption (i.e., 172.44 W) at the time of outputting the RF output signal with the first power. Therefore, by outputting the RF output signal with one half of the first power, it is possible to improve the system operation efficiency and remarkably reduce the system operation cost. A substantial proportion of the efficiency improvement is about 17%.

Hereinafter, a structure of a high power amplifier according to an embodiment of the present invention will be described with reference to FIG. 3.

Figure 3:
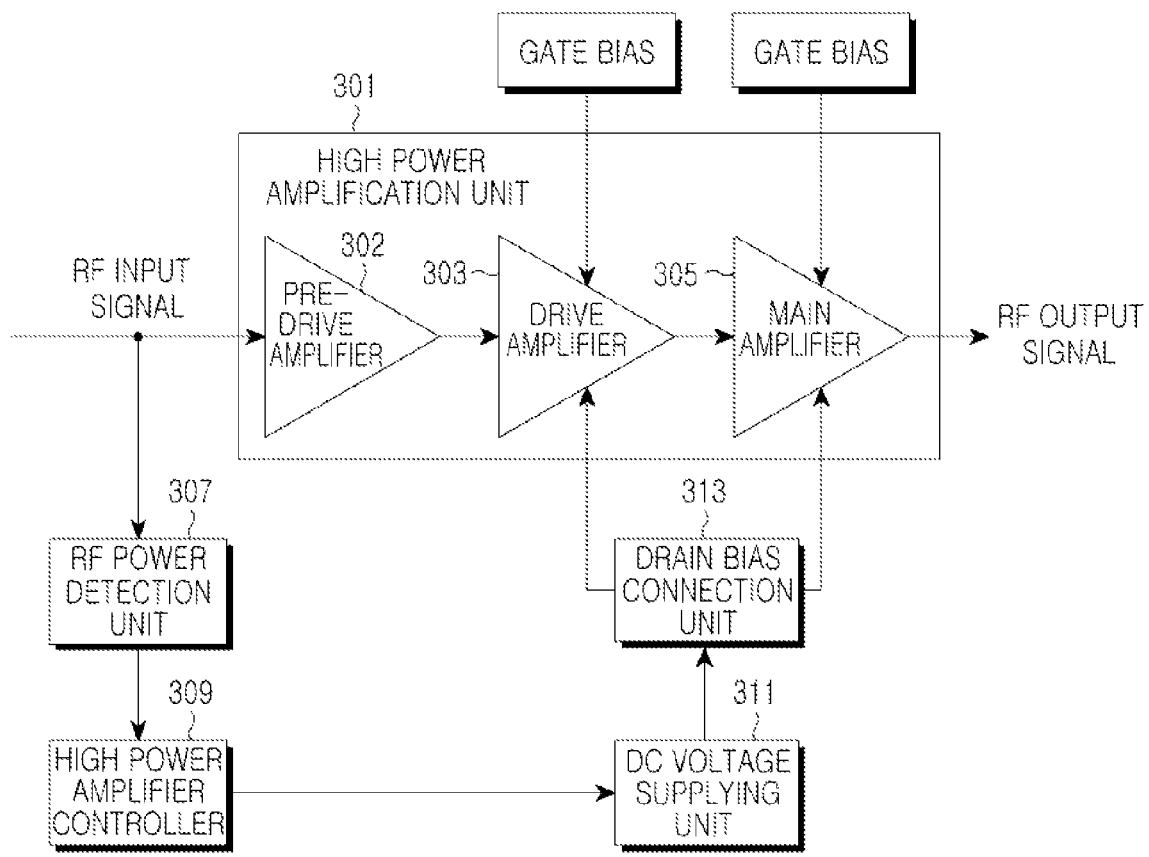
FIG. 3 is a block diagram illustrating a structure of a high power amplifier according to an exemplary embodiment of the present invention.

FIG. 3 is a block diagram illustrating a structure of a high power amplifier according to an exemplary embodiment of the present invention.

The high power amplifier includes a high power amplification unit 301, an RF power detection unit 307, a high power amplifier controller 309, a DC voltage supplying unit 311, and a drain bias connection unit 313. The high power amplification unit 301 includes a drive amplifier 303 and a main amplifier 305. The high power amplification unit 301 may also include a pre-drive amplifier 302. Although FIG. 3 shows that the same drain bias is applied to the drive amplifier 303 and the main amplifier 305, in another exemplary embodiment of the present invention, each of the drive amplifier 303 and the main amplifier 305 may have its own drain bias connection unit or DC voltage supplying unit for application of an independent drain bias.

The RF power detection unit 307 receives an RF input signal, detects the intensity of the RF input signal, and outputs the detected intensity of the RF input signal to the high power amplifier controller 309. For example, the RF power detection unit 307 can detect the intensity of the RF input signal through a coupler (not shown), and can output the detected intensity of the RF input signal based on the voltage and/or current level. The RF input signal refers to a signal input to the high power amplification unit 301, and the intensity of the RF input signal may change according to the number of users of the communication system, the quantity of data traffic, or other factors.

The high power amplifier controller 309 determines a control signal corresponding to the intensity of the RF input signal, the quantity of data traffic, or other factors, and outputs the determined control signal to the DC voltage supplying unit 311. The quantity of data traffic may be given from a higher node (e.g., a data transmission processing unit), and the control signal may include at least one bit for indicating the DC voltage value of the drain bias. The high power amplifier controller 309 may determine the bit value of the control signal by using one of a plurality of different schemes, including a first exemplary scheme using a range for the intensity of the RF input signal, a second exemplary scheme using the intensity of the RF input signal itself, a third exemplary scheme using the quantity of data traffic, etc. According to another exemplary embodiment of the present invention, a combination of at least two schemes from among three or more schemes may be used in determining the bit value of the control signal.

More specifically, according to the first exemplary scheme, the bit value corresponding to the intensity of the RF input signal is determined by using a predefined table. The predefined table may include bit values corresponding to ranges of RF input signal intensities, an example of which is shown in Table 1 below.

TABLE 1

| RF input signal intensity (I) | Bit value | Drain bias voltage |
|---|---|---|
| −10.0 dBm ≦ I < −10.5 dBm | 000 | 31 V |
| −10.5 dBm ≦ I < −11.0 dBm | 001 | 30 V |
| −11.0 dBm ≦ I < −11.5 dBm | 010 | 29 V |
| −11.5 dBm ≦ I < −12.0 dBm | 011 | 28 V |
| −12.0 dBm ≦ I < −12.5 dBm | 100 | 27 V |
| −12.5 dBm ≦ I < −13.0 dBm | 101 | 26 V |

For example, when the RF input signal intensity is larger than or equal to −10.0 dBm and is smaller than −10.5 dBm, the high power amplifier controller 309 may determine the bit value as "000" so that the DC voltage supplying unit 311 can output 31 V, and output the determined bit value to the DC voltage supplying unit 311.

Further, according to the second exemplary scheme, a bit value corresponding to the RF input signal intensity is determined from among the bit values corresponding to predefined RF input signal intensities. For example, when the RF input signal intensity is −10.0 dBm, the high power amplifier controller 309 may determine the bit value as "000" so that the DC voltage supplying unit 311 can output 31 V, and output the determined bit value to the DC voltage supplying unit 311. When the RF input signal intensity is −10.5 dBm, the high power amplifier controller 309 may determine the bit value as "001" so that the DC voltage supplying unit 311 can output 30 V, and output the determined bit value to the DC voltage supplying unit 311. Further, when the RF input signal intensity is −10.7 dBm, the high power amplifier controller 309 may determine the bit value as "001", which is the same as the previous bit value, when the RF input signal intensity is −10.5 dBm, and output the determined bit value to the DC voltage supplying unit 311.

Further, according to the third exemplary scheme, a bit value corresponding to the current data traffic quantity may be determined from among the bit values corresponding to predefined data traffic quantities. For example, when the data traffic quantity is 100%, the high power amplifier controller 309 may determine the bit value as "000" so that the DC voltage supplying unit 311 can output 31 V, and output the determined bit value to the DC voltage supplying unit 311. When the data traffic quantity is less than 50%, the high power amplifier controller 309 may determine the bit value as "101" so that the DC voltage supplying unit 311 can output 26 V, and output the determined bit value to the DC voltage supplying unit 311.

The DC voltage supplying unit 311 generates a DC voltage corresponding to an input control signal (e.g., a bit value) and outputs the generated voltage as a drain bias to the drain bias connection unit 313. For example, when the input bit value is "000", the DC voltage supplying unit 311 may generate 31 V and output the 31 V to the drain bias connection unit 313. When the bit value input from the high power amplifier controller 309 is "101", the DC voltage supplying unit 311 may generate 26 V and output the 26 V to the drain bias connection unit 313. The drain bias connection unit 313 receives the DC voltage input as the drain bias and provides the DC voltage to the drive amplifier 303 and the main amplifier 305, respectively. At this time, the drain bias connection unit 313 may remove the noise of the DC voltage by using at least one capacitor (not shown).

When the high power amplification unit 301 includes the pre-drive amplifier 302, the pre-drive amplifier 302 receives an RF input signal, pre-drive amplifies the RF input signal and outputs the pre-drive amplified RF input signal to the drive amplifier 303.

The drive amplifier 303 receives the RF input signal, which may be pre-drive amplified by the pre-drive amplifier 302, amplifies the RF input signal according to the drain bias, and outputs the amplified signal to the main amplifier 305. The main amplifier 305 receives the amplified RF input signal from the drive amplifier 303, generates the RF output signal by amplifying the RF input signal according to the drain bias, and outputs the generated RF output signal.

Hereinafter, the operation of amplifying the RF input signal by using the changing drain bias by a high power amplifier according to an exemplary embodiment of the present invention will be described with reference to FIGS. 3 and 4.

Figure 4:
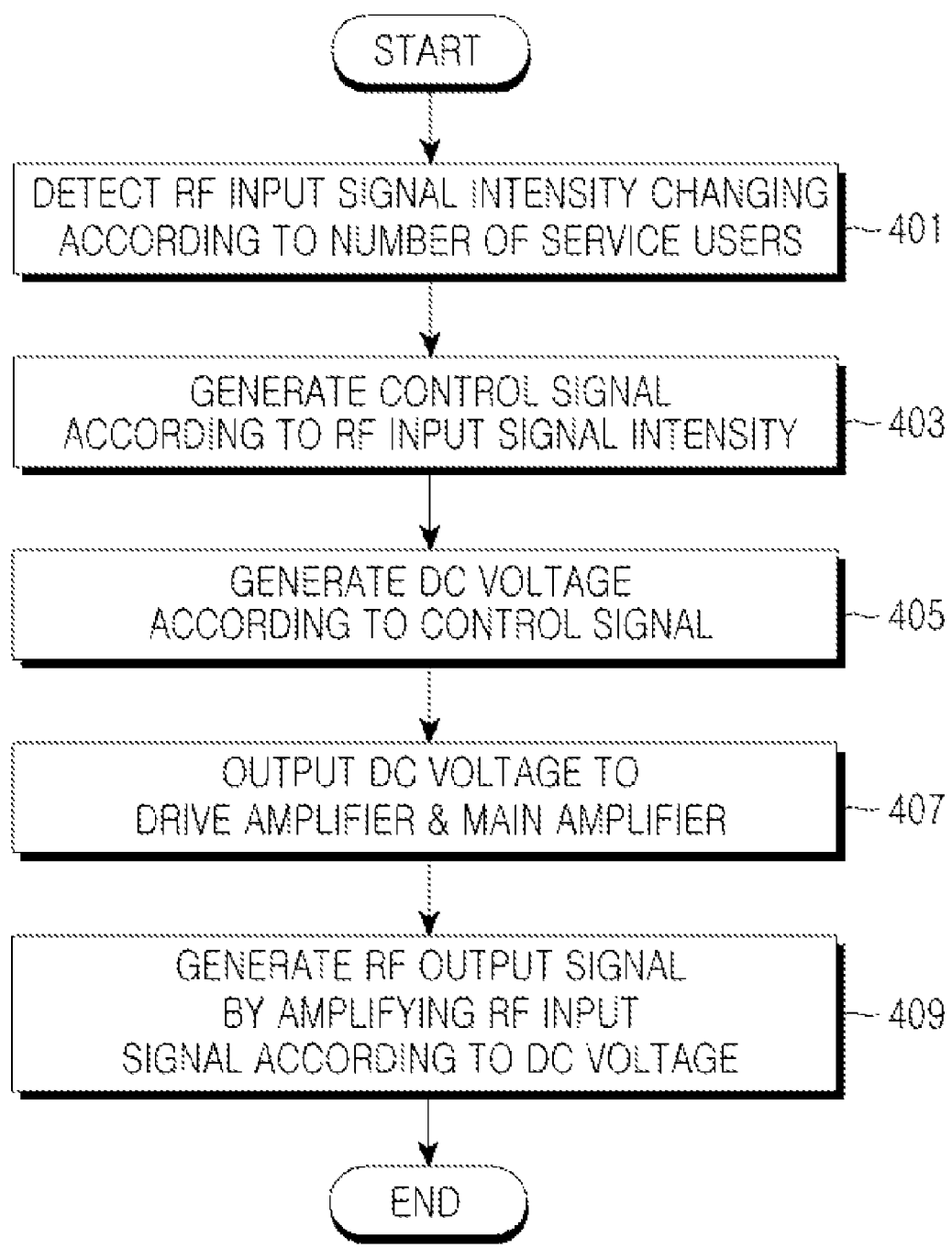
FIG. 4 is a flowchart illustrating a process of amplifying an RF input signal by a high power amplifier according to an exemplary embodiment of the present invention.

FIG. 4 is a flowchart illustrating a process of amplifying an RF input signal by a high power amplifier according to an exemplary embodiment of the present invention.

Referring to FIG. 4, the RF power detection unit 307 detects the RF input signal intensity changing according to the number of users using the service of the communication system, the quantity of the data traffic, or other factors in step 401, and proceeds to step 403. The RF input signal refers to an RF signal input to the high power amplification unit 301.

Further, the high power amplifier controller 309 generates a control signal according to the detected RF input signal intensity in step 403, and proceeds to step 405. The control signal may be expressed by a bit value, and may be determined by at least one of a plurality of different schemes including, for example, a first exemplary scheme using the range of the RF input signal and a second exemplary scheme using the RF input signal itself. The first exemplary scheme refers to a scheme of determining a bit value corresponding to a range of the detected RF input signal intensity in consideration of a table, an example of which is shown in Table 1. The second exemplary scheme refers to a scheme of determining a bit value corresponding to the detected RF input signal intensity itself.

For example, in the case of generating the bit value according to the first exemplary scheme, when the detected RF input signal intensity is larger than or equal to −10.0 dBm and is smaller than −10.5 dBm, the high power amplifier controller 309 may generate a bit value of "000" as a control signal so that the DC voltage supplying unit 311 can output 31 V.

Further, the DC voltage supplying unit 311 generates a DC voltage according to the control signal in step 405, and proceeds to step 407. For example, when the bit value of "000" is input as a control signal, the DC voltage supplying unit 311 generates a DC voltage of 31 V as a drain bias. Further, the drain bias connection unit 313 provides the DC voltage to the drive amplifier 303 and the main amplifier 305 in step 407, and proceeds to step 409. At this time, the drain bias connection unit 313 may eliminate noise of the DC voltage by using at least one capacitor.

Further, in step 409, the drive amplifier 303 and the main amplifier 305 generate the RF output signal by amplifying the RF input signal input to the drive amplifier 303 according to the DC voltage, and output the generated RF output signal to an outer node (e.g., an antenna node) of the high power amplification unit 301.

As described above, a high power communication system according to an exemplary embodiment of the present invention may amplify the RF input signal by using a drain bias that changes according to the RF input signal intensity, thereby reducing the power consumption of a high power amplifier.

Also, when the quantity of data traffic changes according to time, the intensities of the RF input signals also change.

Figure 5:
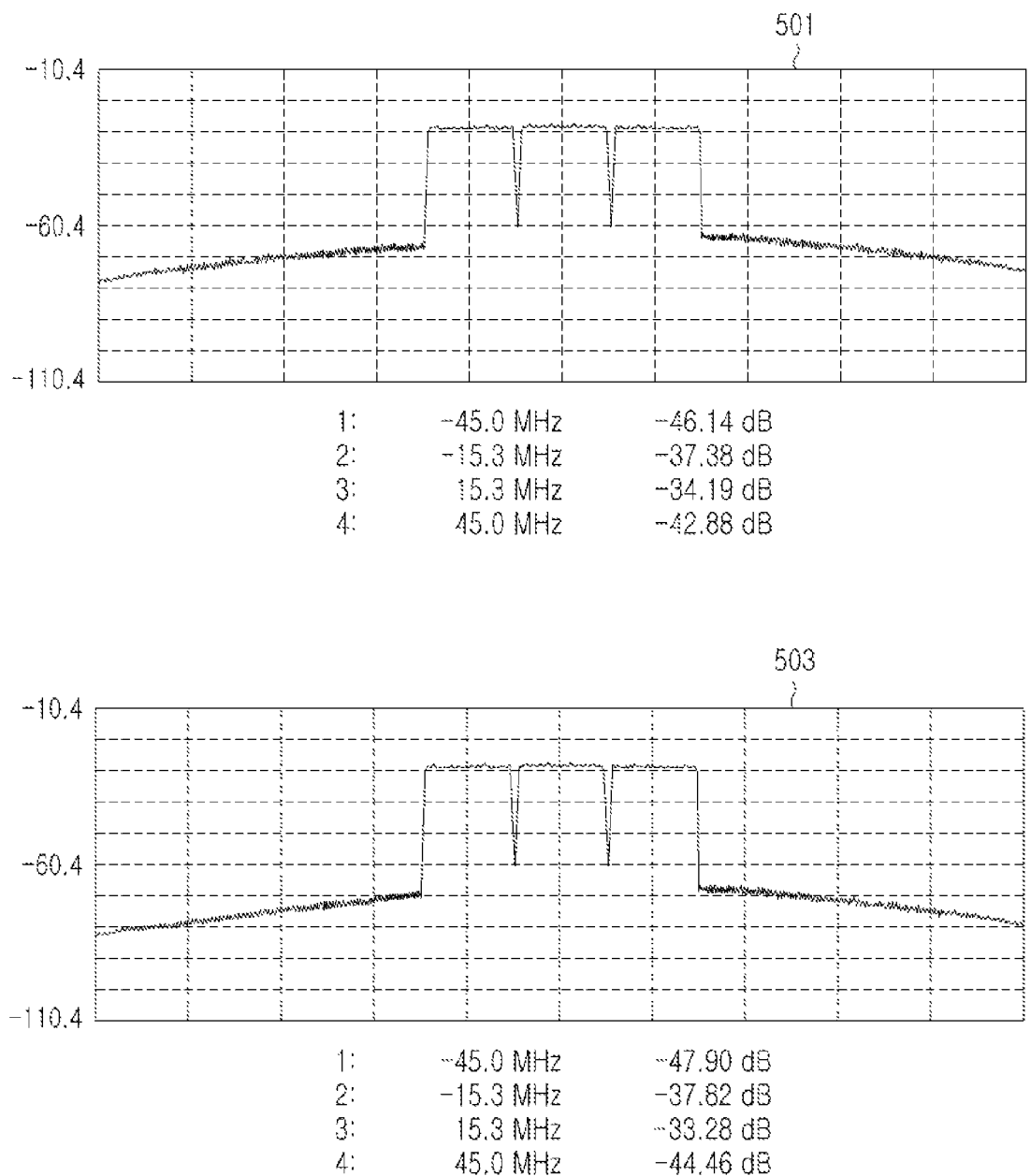
FIG. 5 illustrates normal temperature Adjacent Channel Leakage Ratios (ACLRs) of a high power amplifier according to the related art and a high power amplifier according to an exemplary embodiment of the present invention.

FIG. 5 illustrates normal temperature Adjacent Channel Leakage Ratios (ACLRs) of a high power amplifier according to the related art and a high power amplifier according to an exemplary embodiment of the present invention.

Figure 1:
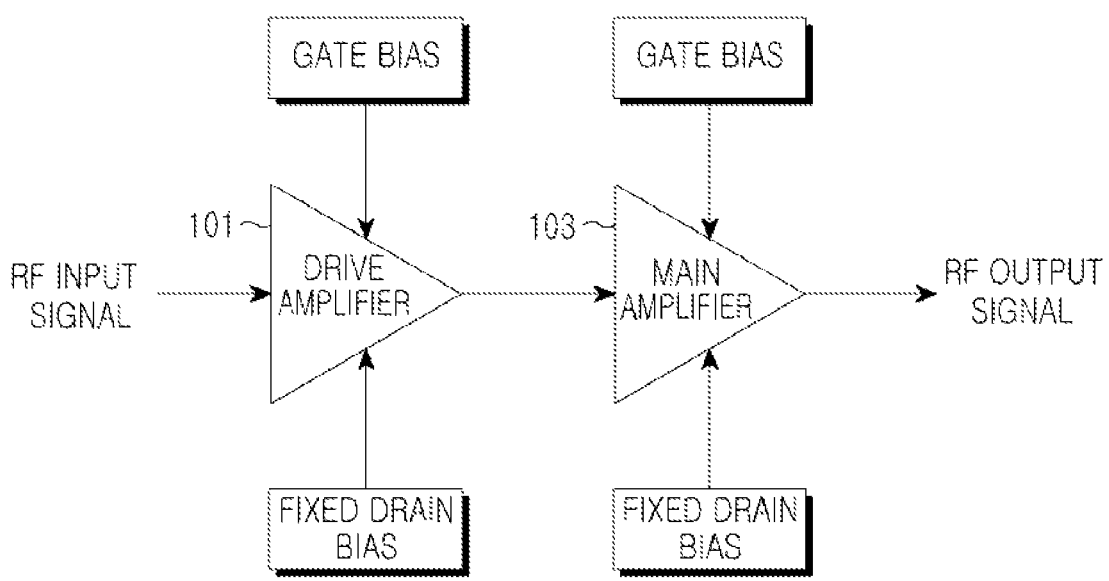
FIG. 1 is a block diagram illustrating a structure of a high power amplifier according to the related art.

Referring to FIG. 5, the graph 501 shows the normal temperature ACLR characteristic of the high power amplifier of the related art as shown in FIG. 1 to which a fixed drain bias is applied. The graph 501 is based on an assumption that the RF output signal has an intensity of 46 dBm, the applied drain bias is 31 V, and 3 Frequency Assignment (FA) sources each having a bandwidth of 10 MHz are used. On this assumption, it is noted that, when the offset frequency is 15.3 MHz, the ACLR has values of −37 dB and −34 dB.

The graph 503 shows the normal temperature ACLR characteristic of the high power amplifier to which a changing drain bias is applied according to an exemplary embodiment of the present invention. The graph 503 is based on an assumption that the RF output signal has an intensity of 43 dBm, which is one half of the RF output signal intensity of the graph 601, the applied drain bias is 26 V, which is 5 V lower than the drain bias of the graph 601, and 3 FA sources each having a bandwidth of 10 MHz are used. On this assumption, it is noted that, when the offset frequency is 15.3 MHz, the ACLR has values of −37 dB and −33 dB.

In the graphs 501 and 503, when the offset frequency is 15.3 MHz, the ACLR values are nearly the same. Therefore, it is noted that the ACLR characteristic of the high power amplifier according to an exemplary embodiment of the present invention is nearly the same as the ACLR characteristic of the high power amplifier of the related art shown in FIG. 1. Since the ACLR characteristics, which indicate the RF characteristics, are the same, it can be stated that the high power amplifier according to an exemplary embodiment of the present invention and the high power amplifier of the related art have nearly the same RF characteristics. Since the RF characteristics are nearly the same as described above, the high power amplifying system according to an exemplary embodiment of the present invention can optimize the efficiency of the communication system by lowering the drain bias without degradation in the performance of the communication system.

In the meantime, the ACLR values of the graphs 501 and 503 correspond to values when the Digital Pre-Distortion (DPD) scheme is not applied to the high power amplifier. If the DPD scheme is not applied, the ACLR value is larger than or equal to −48 dB.

Figure 6:
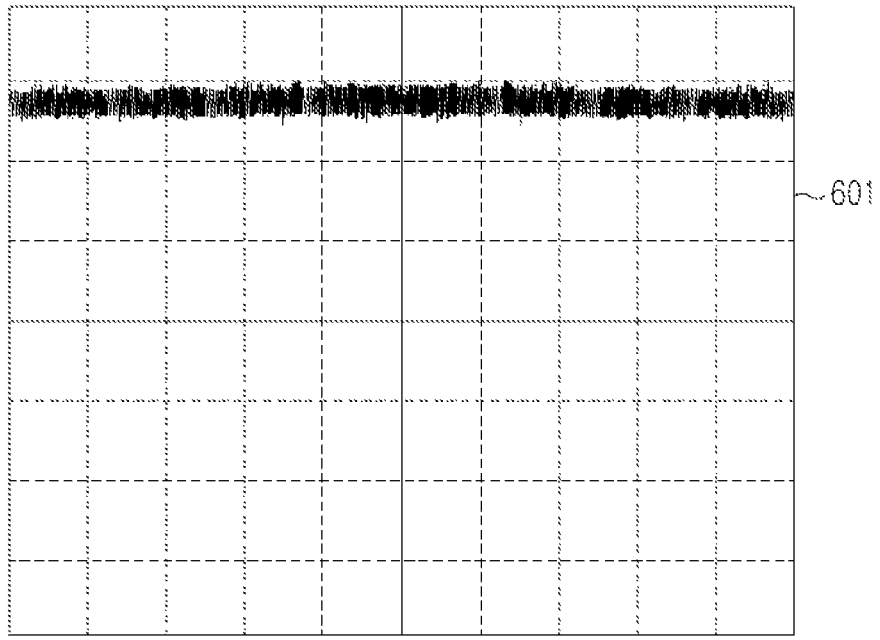
FIG. 6 illustrates power consumption of a high power amplifier according to the related art and a high power amplifier according to an exemplary embodiment of the present invention.
Figure 6:
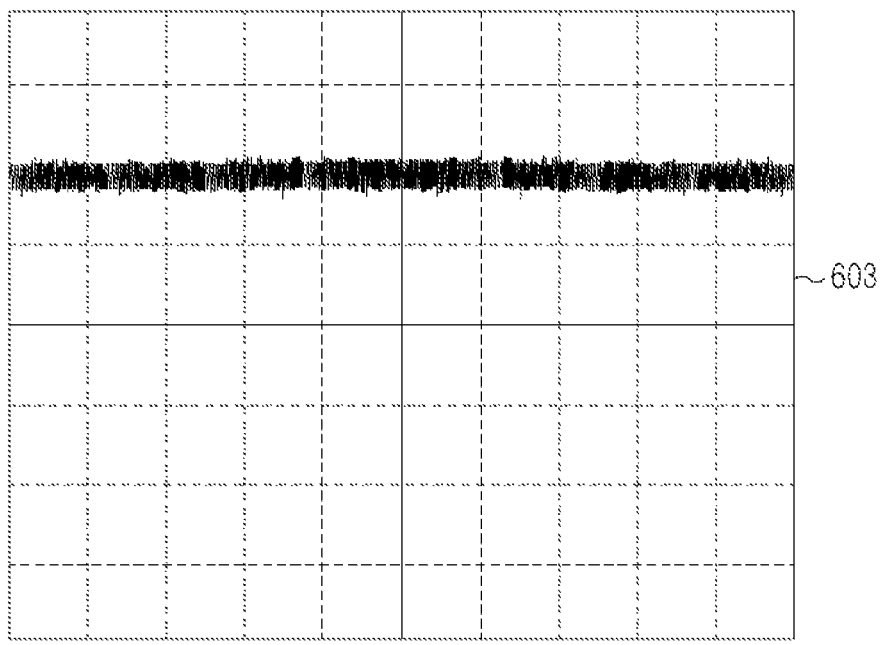

FIG. 6 illustrates power consumption of a high power amplifier according to the related art and a high power amplifier according to an exemplary embodiment of the present invention.

The graph 601 shows the power consumption of the high power amplifier of the related art shown in FIG. 1. It is noted from the graph 601 that the power consumption is about 5.56 A when the RF output signal has an intensity of 46 dBm and the drain bias is 31 V.

The graph 603 shows the power consumption of the high power amplifier according to the present invention. It is noted from the graph 603 that the power consumption is about 3.88 A when the RF output signal has an intensity of 43 dBm and the drain bias is 26 V.

According to an exemplary embodiment of the present invention, it is possible to optimize the efficiency of the high power amplifier by changing the drain bias voltage for a high power amplifier according to the RF input signal intensity. Therefore, exemplary embodiments of the present invention can reduce an operation cost of a communication system and reduce the heat radiation, thereby reducing the size of the high power amplifier.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for controlling a high power amplifier in a communication system, the apparatus comprising:
    a Radio Frequency (RF) power detection unit for detecting an intensity of an RF input signal;
    a high power amplifier controller for determining a control signal, which indicates a voltage value of a drain bias to be provided to at least one drain node from among drain nodes of a drive amplifier and a main amplifier included in the high power amplifier, according to the detected intensity;
    a Direct Current (DC) voltage supplying unit for generating a DC voltage corresponding to the determined control signal;
    a drain bias connection unit for providing the generated DC voltage to said at least one drain node from among the drain nodes of the drive amplifier and the main amplifier; and
    the drive amplifier and the main amplifier for amplifying the RF input signal according to the provided DC voltage.

2. The apparatus of claim 1, wherein the high power amplifier controller determines the control signal corresponding to the detected intensity in consideration of a predefined table, which includes bit values of the control signal corresponding to intensity ranges of the RF input signal.

3. The apparatus of claim 1, wherein the high power amplifier controller determines a bit value corresponding to the detected intensity from among bit values corresponding to predefined RF input signal intensities as the control signal.

4. The apparatus of claim 1, wherein the high power amplifier controller determines a bit value corresponding to a current data traffic quantity from among bit values corresponding to predefined data traffic quantities as the control signal.

5. A method of controlling a high power amplifier in a communication system, the method comprising:
- detecting an intensity of a Radio Frequency (RF) input signal;
- determining a control signal, which indicates a voltage value of a drain bias to be provided to at least one drain node from among drain nodes of a drive amplifier and a main amplifier included in the high power amplifier, according to the detected intensity;
- generating a DC voltage corresponding to the determined control signal;
- providing the generated DC voltage to said at least one drain node from among the drain nodes of the drive amplifier and the main amplifier; and
- amplifying the RF input signal according to the provided DC voltage.

6. The method of claim 5, wherein, when determining the control signal, the control signal corresponding to the detected intensity is determined in consideration of a predefined table, which includes bit values of the control signal corresponding to intensity ranges of the RF input signal.

7. The method of claim 5, wherein, when determining the control signal, a bit value corresponding to the detected intensity from among bit values corresponding to predefined RF input signal intensities is determined as the control signal.

8. The method of claim 5, wherein, when determining the control signal, a bit value corresponding to a current data traffic quantity from among bit values corresponding to predefined data traffic quantities is determined as the control signal.

* * * * *